US010886283B2

(12) United States Patent
Marzaki et al.

(10) Patent No.: US 10,886,283 B2
(45) Date of Patent: Jan. 5, 2021

(54) COMPACT ANTIFUSE ELEMENT AND FABRICATION PROCESS

(71) Applicant: STMicroelectronics (Rousset) SAS, Rousset (FR)

(72) Inventors: Abderrezak Marzaki, Aix en Provence (FR); Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/525,780

(22) Filed: Jul. 30, 2019

(65) Prior Publication Data

US 2020/0043936 A1 Feb. 6, 2020

(30) Foreign Application Priority Data

Jul. 31, 2018 (FR) ..................................... 18 57122

(51) Int. Cl.
*H01L 27/11* (2006.01)
*H01L 27/112* (2006.01)
(Continued)

(52) U.S. Cl.
CPC ........ *H01L 27/11206* (2013.01); *G11C 17/16* (2013.01); *G11C 17/18* (2013.01); *H01L 23/5252* (2013.01); *H01L 23/576* (2013.01)

(58) Field of Classification Search
CPC ........... H01L 27/11206; H01L 23/5252; H01L 23/576; H01L 23/57; G11C 17/16; G11C 17/18
See application file for complete search history.

(56) References Cited

U.S. PATENT DOCUMENTS

2004/0227260 A1* 11/2004 Fukuzumi ......... H01L 21/76229 257/797
2010/0265755 A1* 10/2010 Ching .................. H01L 27/112 365/104

(Continued)

FOREIGN PATENT DOCUMENTS

EP 0528417 A2 2/1993
JP 2001308283 A 11/2001

OTHER PUBLICATIONS

INPI Search Report and Written Opinion for FR 1857122 dated Jun. 21, 2019 (15 pages).

(Continued)

*Primary Examiner* — Ajay Ojha
(74) *Attorney, Agent, or Firm* — Crowe & Dunlevy

(57) ABSTRACT

An integrated circuit includes at least one antifuse element. The antifuse element is formed from a semiconductor substrate, a trench extending down from a first face of the semiconductor substrate into the semiconductor substrate, a first conductive layer housed in the trench and extending down from the first face of the semiconductor substrate into the semiconductor substrate, a dielectric layer on the first face of the semiconductor substrate, and a second conductive layer on the dielectric layer. A program transistor selectively electrically couples the second conductive layer to a program voltage in response to a program signal. A program/read transistor selectively electrically couples the first conductive layer to a ground voltage in response to the program signal and in response to a read signal. A read transistor selectively electrically couples the second conductive layer to a read amplifier in response to the read signal.

33 Claims, 3 Drawing Sheets

(51) Int. Cl.

| | |
|---|---|
| ***H01L 23/00*** | (2006.01) |
| ***G11C 17/18*** | (2006.01) |
| ***G11C 17/16*** | (2006.01) |
| ***H01L 23/525*** | (2006.01) |

(56) References Cited

U.S. PATENT DOCUMENTS

2013/0062698 A1* 3/2013 Agam .................... G11C 17/18 257/368

2015/0235944 A1 8/2015 Filippi et al.

OTHER PUBLICATIONS

De Graaf C et al: "A Novel High Density Low Cost Diode Programmable Read Only Memory," Electron Devices Meeting 1996, International San Francisco CA Dec. 8-11, 1996, pp. 189-192.

Lifka H et al: "Technology of the Diode Programmable Read Only Memory," Proceedingss of the European Solid State Device Research Conference (ESSDERC), Edition Frontieres, Apr. 1, 1997 pp. 272-275.

* cited by examiner

61
Prepare wells
1
62
Form isolation region
3
63
Form trench
64
Form first conductive region
11
65
Form dielectric layer
13
66
Form second conductive region
15
67
Antifuse element obtained
10
68
Program antifuse element
PRG
69
Read antifuse element
RD
72
Produce STI regions
703
73
Form vertical gate trench
74
Form conductive gate region
711
75
Buried vertical-gate transistor obtained
710
NVM

COMPACT ANTIFUSE ELEMENT AND FABRICATION PROCESS

PRIORITY CLAIM

This application claims the priority benefit of French Application for Patent No. 1857122, filed on Jul. 31, 2018, the content of which is hereby incorporated by reference in its entirety to the maximum extent allowable by law.

TECHNICAL FIELD

The present invention relates to antifuse devices, in particular to an integrated antifuse element having a small footprint and being protected from potential fraudulent access.

BACKGROUND

An antifuse is an element that can be programmed once, in which a programmed state corresponds to a conductive state and an unprogrammed state corresponds to a non-conductive state.

Antifuses have been proposed comprising a stack on top of a front face of a substrate, the stack comprised of a first conductive polycrystalline silicon bar, a dielectric layer having a portion of lower thickness defining a breakdown zone, and a second conductive polycrystalline silicon bar. The main problem with these antifuses is that they are bulky in terms of area of the substrate occupied by the embodiments thereof.

Programming involves breaking down the dielectric layer by applying a relatively high voltage between the two conductive regions.

Antifuses of this type, arranged in a matrix, are used to produce read-only memory (ROM) for integrated circuits, for example.

It is desirable for this type of memory to be robust in the face of fraudulent attacks attempting to read the information it contains.

One possible attack involves, after potentially thinning the substrate from its back face, scanning the exposed surface of the back face using a laser beam in order to identify the breakdown zones and to deduce the state of the memory therefrom.

Another type of attack involves removing the upper electrode layer from the memory and then analyzing the chip by using scanning electron microscopy. These methods make it possible to distinguish the broken-down antifuses from the non-broken-down antifuses and hence to deduce the content of the memory therefrom. However, it has been demonstrated that a sufficiently thin breakdown zone of the dielectric layer makes it possible to prevent or to hinder this distinction being made.

Furthermore, conventional antifuses attempting to satisfy these constraints have a relatively substantial footprint, which is problematic in modern technologies which are constantly aiming to decrease the size of components.

There is a need for antifuse elements that are resistant to attacks from the front face and back face of the substrate, that are straightforward to fabricate and to use, and that furthermore have a small footprint.

SUMMARY

In an embodiment, an integrated circuit includes at least one antifuse element, the antifuse element including a stack of: a first conductive region, for example made of polycrystalline silicon; a dielectric layer, for example made of silicon oxide; and a second conductive region, for example made of polycrystalline silicon. The first conductive region is housed in a trench extending from a first face of a semiconductor substrate down into the substrate while the dielectric layer rests on the first face of the substrate and the second conductive region rests on the dielectric layer.

This antifuse structure, including in particular a first conductive region that is housed in a trench, allows the area on which the first conductive region, the dielectric layer and the second conductive region are stacked to be optimized. By way of example, the footprint of such an antifuse element may benefit from a gain area decrease with respect to a conventional structure of the type mentioned above.

Furthermore, such a structure extending down into the substrate is less visible, and thus more difficult to analyze, and is also more troublesome to probe the circuit and to apply an outside voltage thereto.

According to one embodiment, the dielectric layer defines a breakdown zone of the antifuse element facing the first conductive region and the second conductive region.

Since the breakdown zone is defined by the entire area of the dielectric layer facing both the first conductive region and the second conductive region, the breakdown zone may be destroyed or irreversibly damaged if the second conductive region is deconstructed, even if such deconstruction is done fastidiously. Thus, the state of the dielectric layer will not be able to reveal the programmed or unprogrammed state of the antifuse element.

For example, the dielectric layer is configured to break down and become conductive in the presence of a voltage, between the first conductive region and the second conductive region, that is lower than a supply voltage of the integrated circuit.

Specifically, given the structure of the antifuse element according to this aspect, an oxide, such as one used in logic technologies, will have a low breakdown voltage, for example lower than 5 V. Thus, the antifuse element may be programmed immediately during an attack, as a countermeasure in the event an attack is detected.

According to one embodiment, the semiconductor substrate includes an electrical isolation region extending vertically into the substrate from the first face, and the trench housing the first conductive region passes through the isolation region.

According to one embodiment, the integrated circuit includes: a memory plane with a plurality of trenches housing first conductive regions extending in a first direction of the plane of the first face and a plurality of strips of second conductive regions extending in a second direction of the plane of the first face that is perpendicular to the first direction; a stack including a first conductive region, a dielectric layer, and a second conductive region that is located facing each intersection of a trench and a strip forming a respective antifuse element.

The structure of the antifuse element according to this aspect specifically makes it possible to use the trenches directly lengthwise in the first direction to form access lines, in a matrix configuration with access columns formed directly by the second conductive regions in strips in the second direction.

According to one embodiment, the antifuse element is located in a semiconductor well that is housed in the substrate and includes a first contact and a second contact. These contacts are electrically connected by an electrical path through the well. The electrical path has a section that is located between the bottom of the trench and the bottom of the well. The integrated circuit also includes a detection circuit that is configured to detect an electrical discontinuity in the well between the first contact and the second contact.

Thus, in the event an electrical discontinuity is detected in the well between the first contact and the second contact, the detection circuit will be able to control an operation of programming the antifuse elements of the integrated circuit.

According to one embodiment, the integrated circuit also includes a memory, each memory cell of the memory including a buried vertical-gate transistor with a conductive gate region that is housed in a trench extending from the first face of the semiconductor substrate down into the substrate, the arrangement and the materials of which are the same as the first conductive region of the antifuse element.

According to another aspect, what is proposed is a process for fabricating at least one antifuse element, and this process includes: forming a trench extending from a first face of a semiconductor substrate down into the substrate; forming a first conductive region that is housed in the trench; forming a dielectric layer resting on the first face; and forming a second conductive region resting on the dielectric layer.

According to one implementation, the dielectric layer is configured to form a breakdown zone of the antifuse element and to break down and become conductive in the presence of a voltage between the first conductive region and the second conductive region that is lower than a supply voltage of the integrated circuit.

According to one implementation including an operation of forming an isolation region extending vertically into the substrate from the first face, the operation of forming the trench housing the first conductive region is implemented through the isolation region.

According to one implementation, the process also includes the following steps: forming a plurality of trenches and respective first conductive regions, the trenches extending in a first direction of the plane of the first face; forming a plurality of strips of second conductive regions, the strips extending in a second direction of the plane of the first face that is perpendicular to the first direction; and forming dielectric layers that are located facing each intersection of a trench and a strip so as to form a respective memory plane of a respective antifuse element.

According to one implementation, the process includes a prior operation of forming a semiconductor well in the substrate and an operation of forming a first contact and a second contact. These contacts are electrically connected by an electrical path through the well, the electrical path including a section that is located between the bottom of the trench and the bottom of the well. This process also includes an operation of detecting an electrical discontinuity in the well between the first contact and the second contact.

According to one implementation, the process includes a parallel operation of fabricating a buried vertical-gate transistor belonging to a memory cell of a memory of the integrated circuit. This involves an operation of forming a vertical gate trench at the same time and in the same way as the operation of forming the trench extending from a first face of a semiconductor substrate down into the substrate, and an operation of forming a conductive gate region that is housed in the vertical gate trench at the same time as the operation of forming the first conductive region that is housed in the trench.

BRIEF DESCRIPTION OF THE DRAWINGS

Other advantages and features of the invention will become apparent on examining the detailed description of wholly non-limiting embodiments and modes of implementation, and the appended drawings in which.

DETAILED DESCRIPTION

Figure 1:
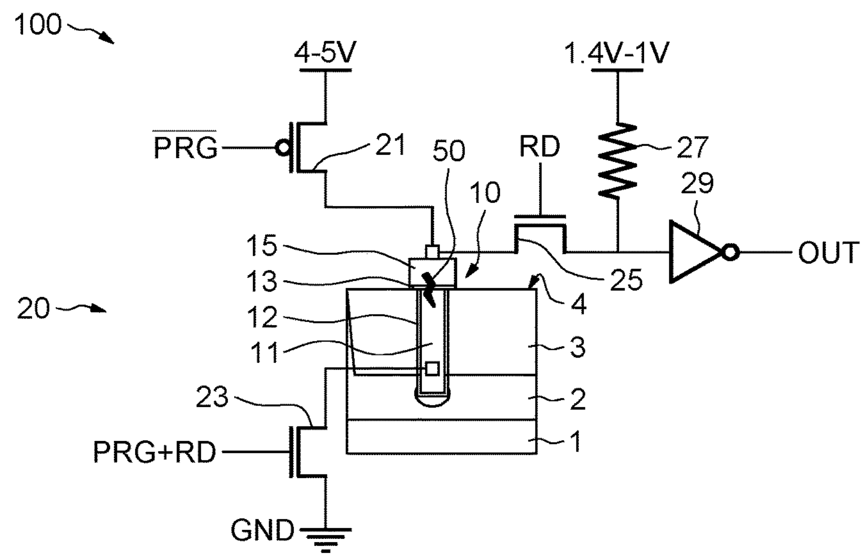
FIG. 1 is a cross sectional view schematically showing an antifuse element belonging to an integrated circuit.

FIG. 1 is a sectional view schematically showing one embodiment of an antifuse element 10 belonging to an integrated circuit 100.

The antifuse 10 is formed in and on a semiconductor substrate 1 comprising an isolation region 3 extending vertically into the substrate 1 from a first face 4, referred to as the front face of the substrate. The front face of the substrate is generally defined as being the face from which the individual components of the integrated circuit are formed, and is sometimes also referred to by the acronym FEOL for front end of line. Conversely, the back face of the substrate is generally the face opposite the front face, defining the volume of the body of the substrate 1.

For example, the isolation region 3 is a shallow trench isolation (STI) comprising a trench filled with silicon oxide formed in the upper portion (i.e. on the front face 4 side) of the substrate 1. Furthermore, in this example, a semiconductor well 2 forming, locally in the substrate, a region of a given conductivity type is shown. A person skilled in the art will however be able to produce the proposed antifuse structure in and on any other type of substrate that is suitable and potentially prepared for this purpose, such as for example a substrate including a triple well, electrically isolated from the rest of the substrate, or for example a substrate including a local oxide (LOCOS for local oxidation of silicon) on the front face thereof.

The antifuse element 10 comprises a stack of a first conductive region 11, for example made of polycrystalline silicon, a dielectric layer 13, for example silicon dioxide, and a second conductive region 15, for example made of polycrystalline silicon.

The first conductive region 11 is housed in a trench extending from the first face 4 of the semiconductor substrate 1 down into the substrate 1. Advantageously, in particular with respect to the embodiments described below with reference to FIGS. 4 and 5, the trench housing the first conductive region 11 extends down into the substrate in particular further than the isolation region 3.

Furthermore, the flanks and the bottom of the trench housing the first conductive layer 11 may be covered by a dielectric envelope 12. At least the portions of the flanks and of the bottom that are surrounded by the semiconductor well 2 are covered by the dielectric envelope 12.

The dielectric layer 13 rests on the first face 4 of the substrate 1 and covers in particular the portion of the first conductive region 11 that is located level with the first face 4. The second conductive region 15 rests on the dielectric layer 13.

The dielectric layer 13 is configured to break down and become conductive in the presence of a sufficiently high voltage between the first conductive region 11 and the second conductive region 15, thus defining a breakdown zone 50 facing the first conductive region 11 and the second conductive region 15. Advantageously, the sufficiently high voltage is lower than a supply voltage delivered by a power supply of the integrated circuit 100, for example 5 V. Specifically, with a dielectric layer 13 breaking down at a voltage that is lower than or equal to the supply voltage of the integrated circuit 100, the programming of antifuse elements, for the purpose of writing or self-destruction, may advantageously be implemented without using a high-voltage generator circuit, for example a charge pump.

In one embodiment example, the dielectric layer 13 corresponds, to this end, to a thin layer of silicon oxide, the thickness of which is of the order of 2 to 3 nm. For example, the dielectric layer 13 may result from a gate fabrication step for logic transistors that are intended to operate at low voltages, of the order of 1 V to 2 V, for technologies using 2 nm gate oxides. Other materials having other thicknesses may be envisaged.

In an unprogrammed state, the dielectric layer 13 electrically insulates the first conductive region 11 from the second conductive region 15.

In the example shown, the second conductive region 15 is connected to a terminal having a high write potential, of the order of 4 V to 5 V, via a p-channel MOS transistor 21. The first conductive region 11 is connected to a low-potential terminal, for example a ground terminal GND, via an n-channel MOS transistor 23. The gates of the transistors 21 and 23 are connected to a write control terminal receiving a signal PRG (and the complement thereof $\overline{PRG}$). Setting the signal PRG to a high state leads to the transistors 21 and 23 being turned on. This results in a write voltage being applied between the first and second conductive regions 11 and 15, causing the antifuse to break down.

Furthermore, the second conductive region 15 is connected to a terminal having a read potential of the order of 1.0 V to 1.4 V via a resistive element 27 and an n-channel MOS transistor 25. The control gates of the transistors 23 and 25 are connected to a read control terminal receiving a signal RD. Setting the signal RD to the high state leads to the transistors 23 and 25 being turned on. This results in a read voltage being applied between the first and second conductive regions 11 and 15. Measuring the current flowing through the transistor 25 then makes it possible to determine the (broken-down or non-broken-down) state of the antifuse, for example by means of a read amplifier 29 connected downstream of the resistive element 27.

Thus, the MOS transistors 21, 23 and 25, and the resistive element 27 and the read amplifier 29 together form an example configuration of a programming/read circuit 20 that is capable of programming the antifuse element, i.e. of making the oxide in the breakdown zone thereof break down, and of reading the broken-down or non-broken-down state of this oxide. It will be noted that the high write potential, which is of the order of 4 V to 5 V, is also in the lower vicinity close to the typical values of supply voltages, for example 5 V.

Thus, the programming/read circuit 20 may furthermore be configured to program the antifuse element immediately, i.e. without a charge pump precharge phase, during an attack in order to conceal the initial information, as a countermeasure in the event an attack is detected. Reference will be made in this regard to the embodiments described below with reference to FIGS. 4 and 5.

Furthermore, because of the low thickness of the dielectric layer 13 (for example of between 2 and 3 nanometers), the removal of the second conductive region 15 by means of typical etch processes inevitably results in damage to the dielectric layer 13. It then becomes impossible to distinguish the broken-down antifuses from the non-broken-down antifuses.

Additionally, in the proposed polycrystalline silicon/dielectric/polycrystalline silicon structure, the breakdown of the dielectric does not result in the formation of detectable craters, either in the well 2 or in the substrate 1.

Moreover, the proposed structure is straightforward to produce using processes for forming trenches housing a conductive central portion, such as in the context of fabricating a buried vertical-gate transistor, and stacks of polycrystalline silicon and dielectric layers, for example those used to fabricate charge storage memory.

Figure 2:
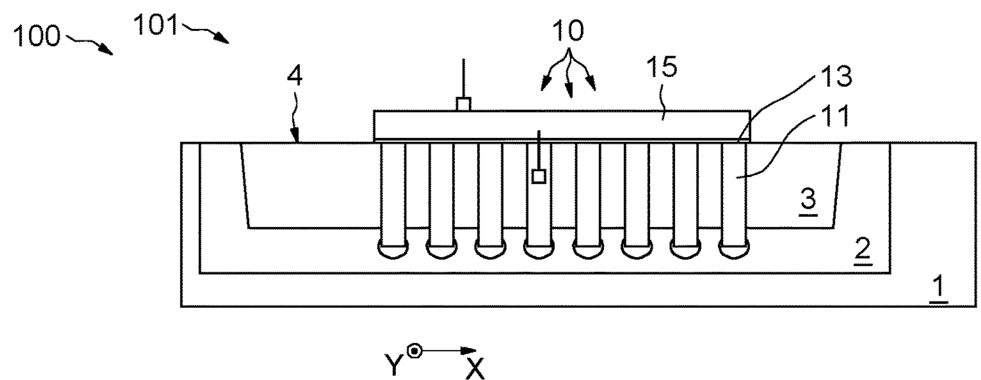
FIG. 2 is a cross sectional view of a memory plane of antifuse elements, such as described with reference to FIG. 1.
Figure 3:
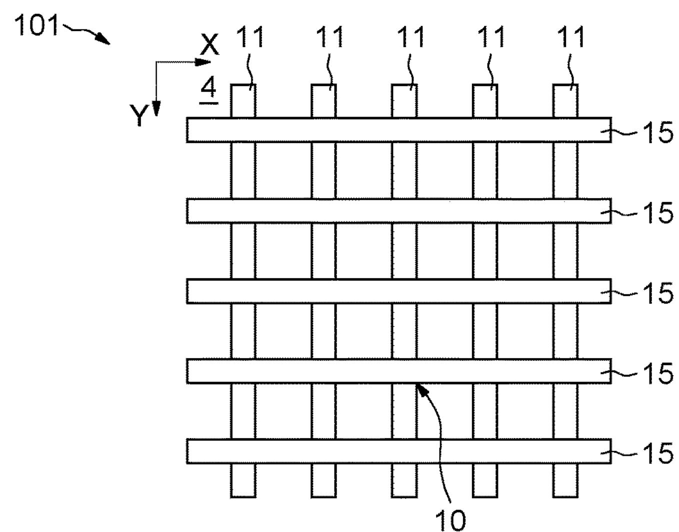
FIG. 3 is another cross sectional view of a memory plane of antifuse elements, such as described with reference to FIG. 1.

FIGS. 2 and 3 show one embodiment example including a memory plane 101 of antifuse elements 10 such as described above with reference to FIG. 1.

In the memory plane 101, a plurality of trenches housing first conductive regions 11 extend in a first direction X and a plurality of strips of second conductive regions 15 extend in a second direction Y that is perpendicular to the first direction X. The first and the second directions belong to the plane of the first face 4.

Each intersection of a trench 11 and of a strip 15, comprising a stack of a first conductive region 11, a dielectric layer 13, and a second conductive region 15, thus form a respective antifuse element 10.

In such a memory plane 101, it is possible to use the first conductive regions 11 in the trenches in the first direction X to form access lines and to use the second conductive regions 15 in strips in the second direction Y to form access columns. The lines and the columns defined in this way allow matrix access for programming and reading each antifuse element 10. Typical memory plane column and line decoders make it possible for example to direct the programming and read signals such as described above with reference to FIG. 1 towards each antifuse element of the memory plane 101.

Using the first and second conductive regions 11 and 15 as access columns and lines in this way, without employing contact zones or allocating an area at the periphery of the breakdown zones, allows the footprint of this memory plane 101 to be substantially decreased.

Figure 4:
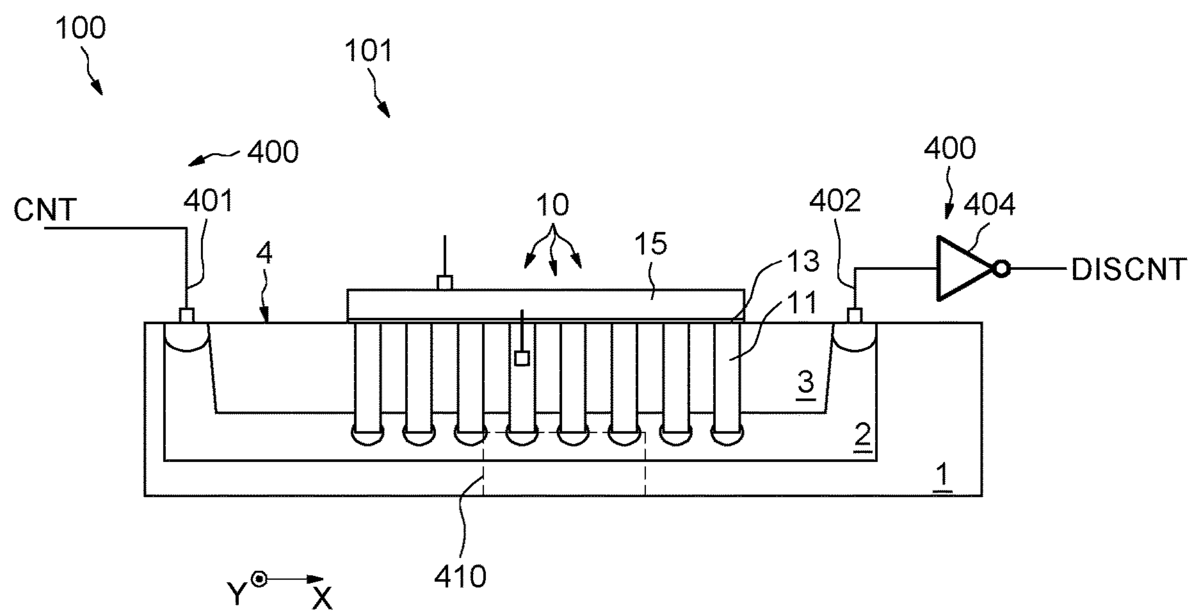
FIG. 4 is a cross sectional view of another implementation of a memory plane of antifuse elements, such as described with reference to FIG. 1.
Figure 5:
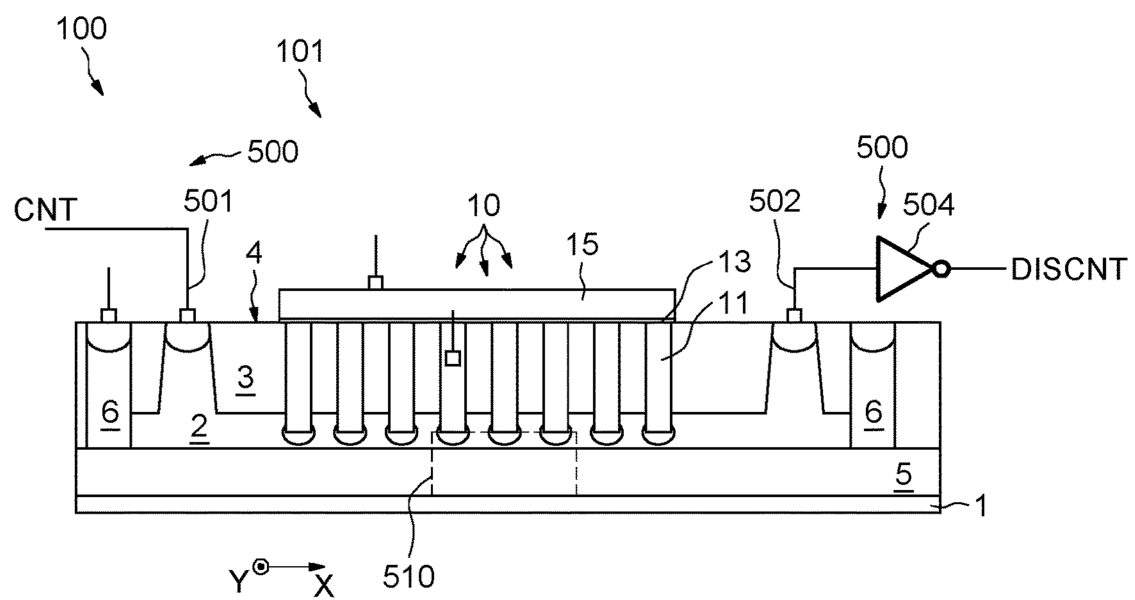
FIG. 5 is a cross sectional view of another implementation of a memory plane of antifuse elements, such as described with reference to FIG. 1.

FIGS. 4 and 5 show two variants of one embodiment example, in which the integrated circuit 100 includes a detection circuit 400/500 that is configured to detect an electrical discontinuity in the well 2 between a first contact 401/501 and a second contact 402/502.

In this embodiment, the antifuse element 10 is located in a semiconductor well 2 that is housed in the semiconductor substrate 1.

In the variant of FIG. 4, the semiconductor well 2 is a single well, i.e. a well having a conductivity type that is opposite the conductivity type of the semiconductor substrate 1. The well 2 and the substrate 1 are thus electrically separated by a single p-n junction that defines in particular the bottom of the well 2.

In the variant of FIG. 5, the semiconductor well 2 is a triple well, i.e. a well having a conductivity type that is the same as the conductivity type of the semiconductor substrate 1. The well 2 and the substrate 1 are electrically separated vertically by a buried semiconductor layer 5 of the opposite conductivity type and laterally by semiconductor shafts 6 that are also of the opposite conductivity type. Thus, two successive inverse p-n/n-p (or n-p/p-n) junctions allow the well 2 and the substrate 1 to be electrically isolated for positive and negative biases. The p-n (or n-p) junction between the well 2 and the buried semiconductor region 5 defines the bottom of the well 2.

In both variants, the semiconductor well 2 includes a first contact 401/501 and a second contact 402/502 that are electrically connected by an electrical path through the well 2. The electrical path passes between the bottom of the trenches housing the first conductive regions 11 and the bottom of the respective well 2. The electrical path therefore comprises a section that is located between the bottom of said trench and the bottom of the well.

Thus, if an etch 410/510 from the back face of the substrate 1 is carried out down to the vicinity of the bottom of the trenches, the electrical path will be broken. Measuring the continuity between the first contact 401/501 and the second contact 402/502 thus allows such an etch to be detected easily.

The detection circuit 400/500 is configured, to this end, to impose a continuity signal CNT on the first contact 401/501 and includes an amplifier 404/504 that is coupled to the second contact 402/502 for the purpose of generating a discontinuity-revealing signal DISCNT if the continuity signal CNT has not been transmitted by the electrical path of the well 2.

In the event an electrical discontinuity in the well 2, between the first contact and the second contact, is detected, the detection circuit 400/500 will be able for example to control the programming/read circuit 20 (illustrated in FIG. 1) so as to make the dielectric layers of all of the antifuse elements 10 of the integrated circuit 100 break down, making the initial information of the memory plane 101 illegible, as a countermeasure against a fraudulent attack.

The embodiment examples described above with reference to FIGS. 1 to 5 are furthermore advantageously compatible with embodiments of buried vertical-gate transistors.

Specifically, a buried vertical-gate transistor, for example belonging to a non-volatile memory cell, typically comprises a conductive gate region 711 that is housed in a vertical gate trench extending from the first face 4 of the substrate 1 down into the substrate 1. Thus, the first conductive regions 11 of the antifuse elements 10, housed in trenches extending from the first face 4 of the semiconductor substrate 1 down into the substrate 1, may advantageously have been produced by means of the same fabrication steps as for the vertical gates of buried transistors.

Thus, the integrated circuit of the embodiments described above may further comprise a memory including memory cells, each memory cell including a buried vertical-gate transistor including a conductive gate region (not shown) that is housed in a trench extending from said first face 4 of the semiconductor substrate 1 down into the substrate 1. The arrangement of the conductive gate region is the same as the arrangement of said first conductive region 11 of the antifuse element 10. The materials of the conductive gate region are the same as the materials of said first conductive region 11 of the antifuse element 10.

Furthermore, the flanks and the bottom of the vertical gate trenches are typically covered by a dielectric envelope, referred to as the gate oxide, as may be the trenches housing the first conductive region 11 in antifuse elements 10 (at least on the portions of the flanks and of the bottom that are surrounded by the semiconductor well 2).

Figure 6:
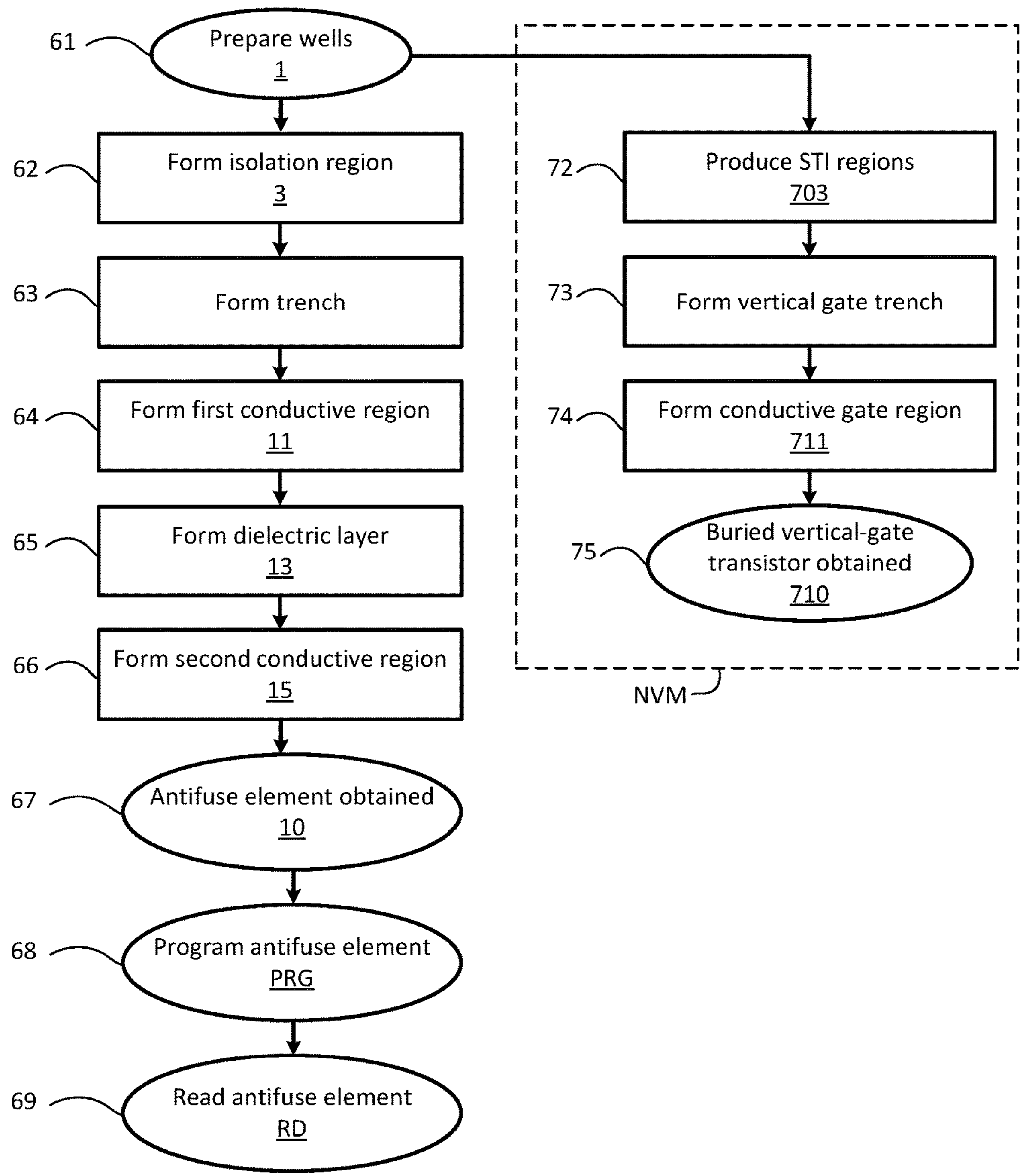
FIG. 6 is a flowchart of one implementation of the invention.

FIG. 6 schematically shows fabrication steps for an integrated circuit such as described above with reference to FIGS. 1 to 5. The references between parentheses refer to FIGS. 1 to 5.

In an initial step 61, wells (2) for example have been prepared in a semiconductor substrate (1) having a first face (4).

A step 62 comprises an operation of forming an isolation region (3) extending vertically into the substrate from the first face (4). For example, this step is implemented according to a process for forming shallow trench isolations (STIs).

A step 63 comprises an operation of forming a trench, intended to house a first conductive region (11), extending from a first face (4) of a semiconductor substrate (1) down into the substrate (1). The operation of forming the trench housing the first conductive region (11) is implemented through the isolation region (3). Step 63 of forming a trench may comprise a dry etch in order to etch the isolation region 3 and the well 2. The operation of forming the trench 63 may further comprise an operation of forming an insulating envelope at least on the portions of the bottom and of the flanks of the trench that are surrounded by the substrate 1.

A step 64 comprises an operation of forming a first conductive region (11) that is housed in said trench. The operation of forming the first conductive region (11) may comprise an operation of depositing polycrystalline silicon, followed by a chemical-mechanical polishing operation in order to remove excess material beyond the level of the first face (4).

A step 65 comprises an operation of forming a dielectric layer (65) resting on the first face (4), in particular on the upper surface of the first conductive region (11) that is housed in said trench. For example, the operation of forming the dielectric layer may comprise an operation of partially or completely growing an oxide layer for an MOS transistor gate that is intended for use in logic operations.

The operation of forming the dielectric layer (13) may be configured to break down and become conductive in the presence of a voltage, between the first conductor region (11) and the second conductive region (15), that is lower than a supply voltage delivered to the integrated circuit (100).

A step 66 comprises an operation of forming a second conductive region (15) resting on the dielectric layer (13). The operation of forming the second conductive layer (15) may also comprise an operation of depositing polycrystalline silicon followed by a dry etch (for example the same etch as that used to define the MOS transistors intended for use in logic operations).

An antifuse element (10) is thus obtained in a step 67, on which programming 68 and read 69 operations may be carried out, for example in the ways described above with reference to FIG. 1.

Furthermore, the process may of course comprise an operation of forming a plurality of trenches and respective first conductive regions (11), extending in a first direction (X), an operation of forming a plurality of strips of second conductive regions (15) extending in a second direction (Y) that is perpendicular to the first direction (X), and an operation of forming dielectric layers (13) that are located facing each intersection of a trench and of a strip so as to form a respective memory plane (101) of a respective antifuse element (10).

Additionally, the process may also comprise an operation of forming, in the substrate (2), a first contact (401, 501) and a second contact (402, 403) that are electrically connected by an electrical path through the well (2) comprising a section that is located between the bottom of said trench and the bottom of the well (2). Thus, a step (400, 500) of detecting an electrical discontinuity (410, 510) in the well (2) between the first contact (401, 501) and the second contact (402, 502) may allow a fraudulent attack to be revealed.

Advantageously, the process may be implemented at the same time as a process for fabricating a buried vertical-gate transistor, for example one belonging to a memory cell of a non-volatile memory. Of course, this implementation is advantageous in the case that the integrated circuit is intended to include a buried vertical-gate transistor, the process described above with reference to steps 61 to 69 being capable of being implemented independently.

In a non-volatile memory NVM portion of one and the same substrate 1 that was prepared in the initial step 61, STI regions 703 are produced in a step 72 at the same time as step 62.

A step 73, carried out at the same time as step 63, comprises an operation of forming a vertical gate trench, intended to house a conductive gate region 711, extending from the first face (4) of the substrate 1 down into the substrate 1. Step 73 comprises an operation of forming a dielectric envelope on the bottom and the flanks of the vertical gate trench.

A step 74, carried out at the same time as step 64, comprises an operation of forming a conductive gate region 711 that is housed in said vertical gate trench.

A buried vertical-gate transistor 710 is thus obtained in a step 75, upon completion in particular of upstream or downstream steps of implanting a drain region at the site of the front face 4 of the substrate 1, at the edge of the vertical gate, and of an operation of forming a buried source region in the well 2, at the bottom of the vertical gate trench.

The invention claimed is:

1. An integrated circuit, comprising:

at least one antifuse element comprising, in a stacked arrangement, a first conductive region, a dielectric layer, and a second conductive region;

wherein the first conductive region is housed in a trench extending from a first face of a semiconductor substrate down into the semiconductor substrate, wherein a top surface of the first conductive region is flush with the first face of the semiconductor substrate;

wherein the dielectric layer extends on and across the first face of the semiconductor substrate and extends on and across the top surface of the first conductive region; and wherein the second conductive region rests on the dielectric layer.

2. The integrated circuit according to claim 1, wherein the dielectric layer defines a breakdown zone of the at least one antifuse element facing the first conductive region and the second conductive region.

3. The integrated circuit according to claim 2, wherein the dielectric layer is configured to break down and become conductive in a presence of a voltage between the first conductive region and the second conductive region that is lower than a supply voltage of the integrated circuit.

4. An integrated circuit, comprising:

at least one antifuse element comprising, in a stacked arrangement, a first conductive region, a dielectric layer, and a second conductive region;

wherein the first conductive region is housed in a trench extending from a first face of a semiconductor substrate down into the semiconductor substrate;

wherein the dielectric layer rests on the first face of the semiconductor substrate;

wherein the second conductive region rests on the dielectric layer; and wherein the semiconductor substrate comprises an electrical isolation region extending vertically into the semiconductor substrate from the first face, and wherein the trench housing the first conductive region passes through the electrical isolation region.

5. An integrated circuit comprising:

a plurality of antifuse elements arranged in a matrix configuration of columns and rows, each antifuse element comprising, in a stacked arrangement, a first conductive region, a dielectric layer, and a second conductive region;

wherein the first conductive regions of ones of the plurality of antifuse elements located in a same column form first strips and are housed in a trench extending from a first face of a semiconductor substrate down into the semiconductor substrate;

wherein the dielectric layer rests on the first face of the semiconductor substrate;

wherein the second conductive region rests on the dielectric layer; and wherein the second conductive regions of ones of the plurality of antifuse elements located in a same row form second strips intersecting the first strips perpendicularly.

6. An integrated circuit, comprising:

at least one antifuse element comprising, in a stacked arrangement, a first conductive region, a dielectric layer, and a second conductive region;

wherein the first conductive region is housed in a trench extending from a first face of a semiconductor substrate down into the semiconductor substrate;

wherein the dielectric layer rests on the first face of the semiconductor substrate;

wherein the second conductive region rests on the dielectric layer; and wherein the at least one antifuse element is located in a semiconductor well that is housed in the semiconductor substrate and includes a first contact and a second contact, the first and second contacts being electrically connected by an electrical path through the semiconductor well, the electrical path comprising a section that is located between a bottom of the trench and a bottom of the semiconductor well, wherein the integrated circuit further includes a detection circuit that is configured to detect an electrical discontinuity in the semiconductor well between the first and second contacts.

7. An integrated circuit, comprising:

a plurality of antifuse elements comprising, in a stacked arrangement, a first conductive region, a dielectric layer, and a second conductive region;

wherein the first conductive region is housed in a trench extending from a first face of a semiconductor substrate down into the semiconductor substrate;

wherein the dielectric layer rests on the first face of the semiconductor substrate;

wherein the second conductive region rests on the dielectric layer; and a memory formed in the semiconductor substrate, the memory including memory cells, each memory cell including a buried vertical-gate transistor including a conductive gate region that is housed in the trench of a different one of the plurality of antifuse elements.

8. The integrated circuit according to claim 1, further comprising:

a program transistor selectively electrically coupling the second conductive region to a program voltage in response to a program signal;

a program/read transistor selectively electrically coupling the first conductive region to a ground voltage in response to the program signal and in response to a read signal; and a read transistor selectively electrically coupling the second conductive region to a read amplifier in response to the read signal.

9. A process for fabricating at least one antifuse element in an integrated circuit, comprising:

forming a trench extending from a first face of a semiconductor substrate down into the semiconductor substrate;

forming a first conductive region that is housed in the trench, wherein a top surface of the first conductive region is flush with the first face of the semiconductor substrate;

forming a dielectric layer extending on and across the first face and extending on and across the top surface of the first conductive region; and forming a second conductive region resting on the dielectric layer.

10. The process according to claim 9, wherein the dielectric layer is configured to form a breakdown zone of the at least one antifuse element, the breakdown zone configured to break down and become conductive in a presence of a voltage between the first conductive region and the second conductive region, the voltage being lower than a supply voltage of the integrated circuit.

11. A process for fabricating at least one antifuse element in an integrated circuit, comprising:

forming a trench extending from a first face of a semiconductor substrate down into the semiconductor substrate;

forming a first conductive region that is housed in the trench;

forming a dielectric layer resting on the first face;

forming a second conductive region resting on the dielectric layer; and forming an isolation region extending vertically into the semiconductor substrate from the first face, wherein the forming the trench housing the first conductive region is implemented through the isolation region.

12. A process for fabricating at least one antifuse element in an integrated circuit, comprising:

forming a trench extending from a first face of a semiconductor substrate down into the semiconductor substrate;

forming a first conductive region that is housed in the trench;

forming a dielectric layer resting on the first face;

forming a second conductive region resting on the dielectric layer;

wherein the at least one antifuse element comprises a plurality of antifuse elements formed in a first direction of a plane of the first face and according to the steps of the process; and forming a plurality of strips of second conductive regions, the strips of second conductive regions extending in a second direction of the plane of the first face, the second direction perpendicular to the first direction;

wherein each second conductive region is formed to intersect a dielectric layer of one of the plurality of antifuse elements to define a memory plane.

13. A process for fabricating at least one antifuse element in an integrated circuit, comprising:

forming a trench extending from a first face of a semiconductor substrate down into the semiconductor substrate;

forming a first conductive region that is housed in the trench;

forming a dielectric layer resting on the first face;

forming a second conductive region resting on the dielectric layer;

forming a semiconductor well in the semiconductor substrate; and forming first and second contacts electrically connected by an electrical path through the semiconductor well, the electrical path comprising a section located between a bottom of the trench and a bottom of the semiconductor well.

14. A process for fabricating at least one antifuse element in an integrated circuit, comprising:

forming a trench extending from a first face of a semiconductor substrate down into the semiconductor substrate;

forming a first conductive region that is housed in the trench;

forming a dielectric layer resting on the first face;

forming a second conductive region resting on the dielectric layer; and a parallel step of fabricating a buried vertical-gate transistor belonging to a memory cell of a memory of the integrated circuit, the parallel step comprising:

forming a vertical gate trench at a same time and as forming the trench; and forming a conductive gate region housed in the vertical gate trench at a same time as forming the first conductive region.

15. An integrated circuit, comprising:

an antifuse element comprising:

a semiconductor substrate;

a trench extending down from a first face of the semiconductor substrate into the semiconductor substrate;

a first conductive layer housed in the trench and extending down from the first face of the semiconductor substrate into the semiconductor substrate;

a dielectric layer on the first face of the semiconductor substrate; and a second conductive layer on the dielectric layer;

a program transistor selectively electrically coupling the second conductive layer to a program voltage in response to a program signal;

a program/read transistor selectively electrically coupling the first conductive layer to a ground voltage in response to the program signal and in response to a read signal; and a read transistor selectively electrically coupling the second conductive layer to a read amplifier in response to the read signal.

16. The integrated circuit of claim 15, wherein the program transistor comprises a PMOS transistor having a source coupled to the program voltage, a drain coupled to the second conductive layer, and a gate coupled to a complement of the program signal; and wherein the program voltage is less than a supply voltage of the integrated circuit.

17. The integrated circuit of claim 15, wherein the program/read transistor comprises an NMOS transistor having a drain coupled to the first conductive layer, a source coupled to ground, and a drain coupled to the program signal and to the read signal.

18. The integrated circuit of claim 15, wherein the read transistor and read amplifier are coupled at a node; and further comprising a resistor coupled between the node and a voltage less than the program voltage but greater than ground.

19. The integrated circuit of claim 15, wherein the trench is lined by a dielectric envelope along its sides, and wherein the dielectric envelope covers the first conductive layer.

20. The integrated circuit of claim 15, wherein the first face of the semiconductor substrate is on an isolation region of the semiconductor substrate;

wherein the semiconductor substrate also has a semiconductor well that is formed therein below the isolation region; and wherein the trench extends from the first face into the semiconductor well.

21. The integrated circuit of claim 20, further comprising a continuity testing circuit arranged and configured to test continuity between different portions of the semiconductor well.

22. The integrated circuit according to claim 4, wherein the dielectric layer defines a breakdown zone of the at least one antifuse element facing the first conductive region and the second conductive region.

23. The integrated circuit according to claim 22, wherein the dielectric layer is configured to break down and become conductive in a presence of a voltage, between the first conductive region and the second conductive region, that is lower than a supply voltage of the integrated circuit.

24. The integrated circuit according to claim 5, wherein the dielectric layer defines a breakdown zone of the plurality of antifuse elements facing the first conductive region and the second conductive region.

25. The integrated circuit according to claim 24, wherein the dielectric layer is configured to break down and become conductive in a presence of a voltage, between the first conductive region and the second conductive region, that is lower than a supply voltage of the integrated circuit.

26. The integrated circuit according to claim 6, wherein the dielectric layer defines a breakdown zone of the at least one antifuse element facing the first conductive region and the second conductive region.

27. The integrated circuit according to claim 26, wherein the dielectric layer is configured to break down and become conductive in a presence of a voltage, between the first conductive region and the second conductive region, that is lower than a supply voltage of the integrated circuit.

28. The integrated circuit according to claim 7, wherein the dielectric layer defines a breakdown zone of the plurality of antifuse elements facing the first conductive region and the second conductive region.

29. The integrated circuit according to claim 28, wherein the dielectric layer is configured to break down and become conductive in a presence of a voltage, between the first conductive region and the second conductive region, that is lower than a supply voltage of the integrated circuit.

30. The process according to claim 11, wherein the dielectric layer is configured to form a breakdown zone of the at least one antifuse element, the breakdown zone configured to break down and become conductive in a presence of a voltage between the first conductive region and the second conductive region, the voltage being lower than a supply voltage of the integrated circuit.

31. The process according to claim 12, wherein the dielectric layer is configured to form a breakdown zone of the at least one antifuse element, the breakdown zone configured to break down and become conductive in a presence of a voltage between the first conductive region and the second conductive region, the voltage being lower than a supply voltage of the integrated circuit.

32. The process according to claim 13, wherein the dielectric layer is configured to form a breakdown zone of the at least one antifuse element, the breakdown zone configured to break down and become conductive in a presence of a voltage between the first conductive region and the second conductive region, the voltage being lower than a supply voltage of the integrated circuit.

33. The process according to claim 14, wherein the dielectric layer is configured to form a breakdown zone of the at least one antifuse element, the breakdown zone configured to break down and become conductive in a presence of a voltage between the first conductive region and the second conductive region, the voltage being lower than a supply voltage of the integrated circuit.

* * * * *